United States Patent [19]

Ariyoshi

[11] Patent Number: 5,517,162

[45] Date of Patent: May 14, 1996

[54] DIELECTRIC RESONATOR INCLUDING A PLURALITY OF SOLDER BUMPS AND METHOD OF MOUNTING DIELECTRIC RESONATOR

[75] Inventor: Hisashi Ariyoshi, Nagaokakyo, Japan

[73] Assignee: Murata Manufacturing Co., Ltd., Japan

[21] Appl. No.: 136,582

[22] Filed: Oct. 13, 1993

[30] Foreign Application Priority Data

Oct. 14, 1992 [JP] Japan ..................................... 4-275881

[51] Int. Cl.⁶ ................................. H01P 7/04; H05K 3/34
[52] U.S. Cl. ............................ 333/222; 333/206; 361/760
[58] Field of Search .................................... 333/202, 203, 333/206, 207, 222, 223, 246, 247; 361/760, 761, 763–765

[56] References Cited

U.S. PATENT DOCUMENTS

| | | | |
|---|---|---|---|
| 4,463,059 | 7/1984 | Bhattacharya et al. | 257/763 X |
| 4,673,902 | 6/1987 | Takeda et al. | 333/222 X |
| 4,739,448 | 4/1988 | Rowe et al. | 333/238 X |
| 4,806,725 | 2/1989 | Narizuka et al. | 219/216 |
| 4,879,533 | 11/1989 | de Muro et al. | 333/206 |
| 5,023,580 | 6/1991 | Kim et al. | 333/206 |
| 5,045,824 | 9/1991 | Metroka | 333/206 |
| 5,208,213 | 5/1993 | Ruby | 333/161 |

FOREIGN PATENT DOCUMENTS

| | | | |
|---|---|---|---|
| 0556573 | 8/1993 | European Pat. Off. | |
| 0103203 | 4/1992 | Japan | 333/202 |

OTHER PUBLICATIONS

Ariyoshi et al., "Mixed IC Construction of Solder Melting Connection type", Research Practical Application Report vol. 26, No. 6, 1977, pp. 1603–1629.

Primary Examiner—Benny Lee
Attorney, Agent, or Firm—Ostrolenk, Faber, Gerb & Soffen

[57] ABSTRACT

A dielectric resonator device includes a dielectric member, inner conductors provided in the dielectric member, an outer conductor formed on an outer surface of the dielectric member, signal input and output electrodes formed on the outer surface of the dielectric member opposing a mounting substrate and coupled with the inner conductors, and solder bumps formed on the outer conductor on its surface opposing the mounting substrate and on the signal input and output electrodes. By heating the dielectric resonator device opposing the mounting substrate, electrical and mechanical connections may be made therebetween through the solder bumps, while preventing the formation of solder bridges.

19 Claims, 3 Drawing Sheets

DIELECTRIC RESONATOR INCLUDING A PLURALITY OF SOLDER BUMPS AND METHOD OF MOUNTING DIELECTRIC RESONATOR

BACKGROUND OF THE INVENTION

1. Field of the Invention

The present invention generally relates to a dielectric resonator device, and more particularly, to a dielectric resonator device which includes inner conductors provided within a dielectric member, and signal input and output electrodes formed on the outer surface of the dielectric member together with an outer conductor. The present invention relates to a mounting arrangement for mounting the dielectric resonator device of the above described type on a mounting substrate.

The dielectric resonator device which includes inner conductors formed within a dielectric member or dielectric block, and an outer conductor formed on the outer surface of the dielectric block is used, for example, as a band-pass filter or the like in a microwave band region.

The dielectric resonator device of this kind is normally formed by a resonator device provided with lead terminals, in which, by inserting signal input and output pins into bores of the dielectric block formed with inner conductors, the pins can be used as leads for signal input and output.

However, in order to meet an ever increasing demand for compact size in recent years, for making it possible to mount the dielectric resonator device on the surface of mounting substrates such as printed circuit boards, etc. in a manner similar to the mounting of other electronic parts, there has also been conventionally employed a mounting arrangement in which electrical connection and mechanical connection are simultaneously effected by providing signal input and output electrodes directly on the surface of the outer face of the dielectric block for soldering between said electrodes and the mounting substrate, for example, as disclosed in Japanese Patent Application Tokuganhei No. 4-9207 filed earlier by the present applicant.

For mounting a dielectric resonator device of a surface mounting type with respect to a mounting substrate, in a manner similar to the mounting of other electronic parts of the surface mounting type such as chip resistors, chip capacitors, etc., the so-called reflow soldering process is employed. This process uses solder paste (cream solder) which is preliminarily applied onto conductor patterns on the mounting substrate, and the dielectric resonator device is placed thereon for temporary fixing, whereby the soldering is effected by locally heating the entire mounting substrate or the dielectric resonator device portion to be mounted.

Such reflow soldering is a superior mounting method suitable for an automatic mounting machine of electronic parts, and also for attaching very small electronic parts. However, in the case of the dielectric resonator device, there is such a peculiar point as compared with other general chip resistors, chip capacitors, surface mounting type variable resistors or surface mounting type transformers, etc., that there are employed signal input and output electrodes formed to be separated, in an island form, from an outer conductor provided on the outer surface of the dielectric block of the resonator device. Therefore, in spite of the fact that the dielectric resonator device has a larger overall size as compared with other general chip parts, there are several disadvantages. For example, solder bridges tend to be formed between the signal input and output electrodes and the outer conductor because the clearance therebetween is small. Also the signal input and output electrodes are mainly formed on the bottom face of the dielectric block opposing the mounting substrate, and moreover, not only the signal input and output electrodes, but the outer conductor of a comparatively large area present on the surface facing the mounting substrate must also be connected simultaneously. Thus, mounting of the dielectric resonator device becomes difficult as compared with that of the ordinary chip parts, etc.

SUMMARY OF THE INVENTION

Accordingly, an essential object of the present invention is to provide a dielectric resonator device which can be mounted in a method different from the reflow soldering process, with substantial elimination of problems inherent in the conventional resonator devices of this kind.

Another object of the present invention is to provide a mounting arrangement of the dielectric resonator device of the above described type with respect to a mounting substrate.

In accomplishing these and other objects, according to one aspect of the present invention, there is provided a dielectric resonator device which includes a dielectric member, inner conductors provided in the dielectric member, an outer conductor formed on an outer surface of the dielectric member, signal input and output electrodes formed at parts of the surface of the dielectric member opposing a mounting substrate so as to be coupled with the inner conductor, and solder bumps respectively formed on the surface of the outer conductor which opposes the mounting substrate and on the signal input and output electrodes. Therefore, the surface mounting may be effected by placing the dielectric resonator device at a predetermined position on the mounting substrate, and melting the solder bumps by heating the entire mounting substrate or locally heating the dielectric resonator device. Since the solder bumps are preliminarily formed on the outer conductor and the signal input and output electrodes respectively, there is no possibility of forming the solder bridges between the outer conductor and the signal input and output electrodes as in the melting of solder paste in the reflow soldering process.

In another aspect, the present invention provides a mounting arrangement for mounting a dielectric resonator device with respect to a mounting substrate, and the mounting arrangement comprises the dielectric resonator device including a dielectric member, inner conductors provided in the dielectric member, an outer conductor formed on an outer surface of the dielectric member and, signal input and output electrodes formed at parts of the surface of the dielectric member opposing a mounting substrate so as to be coupled with said inner conductors, and a mounting substrate disposed to oppose the said dielectric resonator device. The outer conductor and the signal input and output electrodes are connected to the mounting substrate by solder bumps through melting thereof.

Since the joining faces between the mounting substrate and the dielectric resonator device are connected by melting the solder bumps, the signal input and output electrodes and the outer conductor are positively connected to respective electrodes on the mounting substrate both electrically and mechanically, and moreover, no solder bridges are formed between the signal input and output electrodes and the outer conductor.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
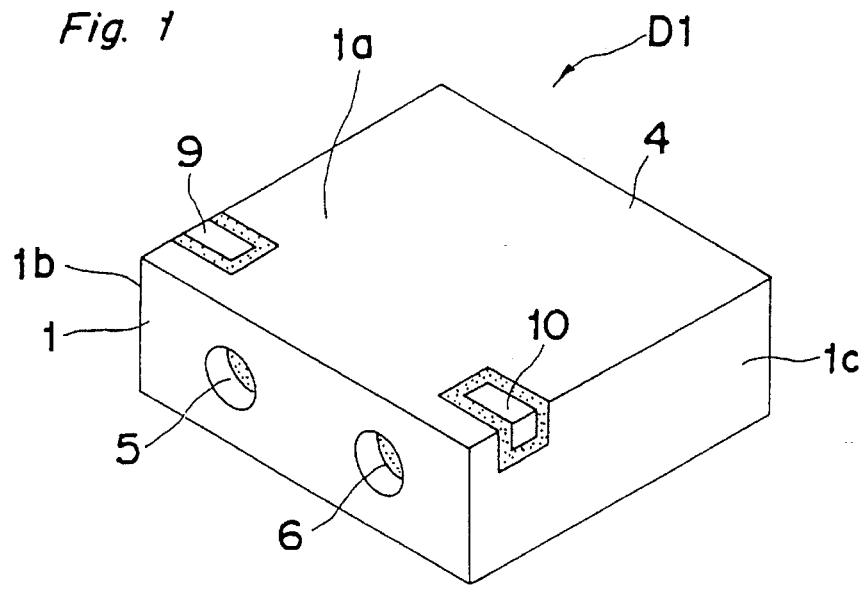
FIG. 1 is a perspective view showing the construction of a dielectric resonator device according to one preferred embodiment of the present invention.

Before the description of the present invention proceeds, it is to be noted that like parts are designated by like reference numerals throughout the accompanying drawings.

Figure 2:
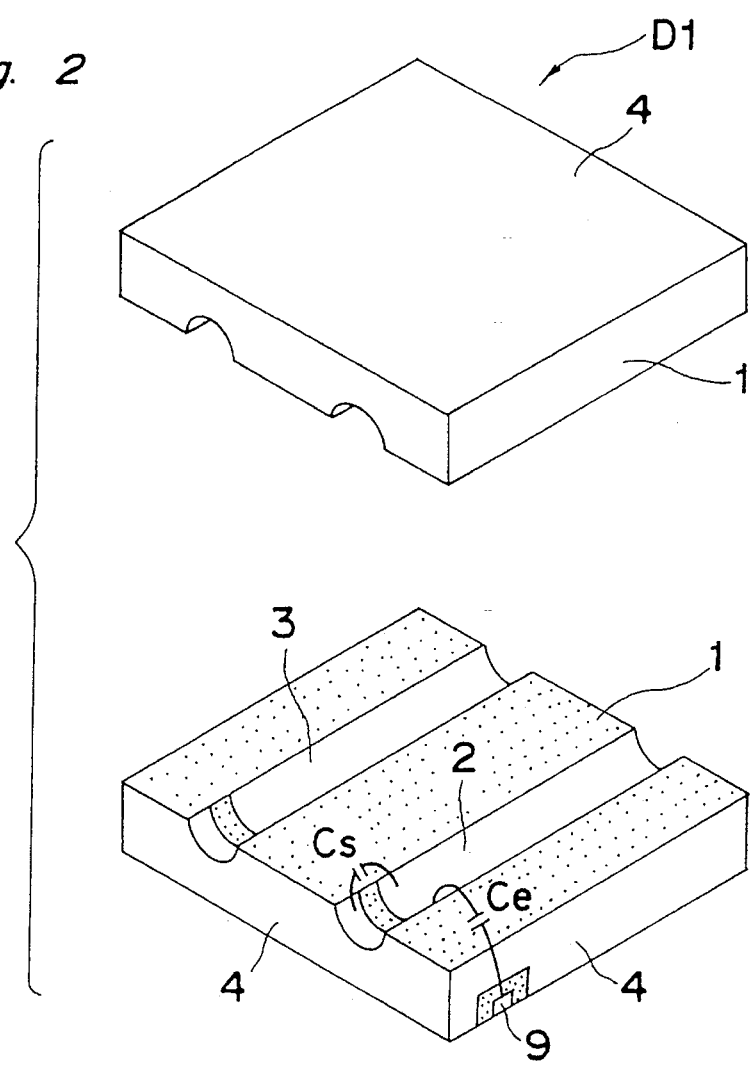
FIG. 2 is an exploded perspective view showing an internal construction of the dielectric resonator device of FIG. 1.

Referring now to the drawings, there is shown in FIGS. 1 and 2, a dielectric resonator device D1 according to one preferred embodiment of the present invention, which generally includes a dielectric block 1 in an approximately hexahedron shape formed with longitudinally extending inner conductor forming bores 5 and 6, inner conductors 2 and 3 respectively formed on inner surfaces of the bores 5 and 6, an outer conductor 4 formed on outer six faces of the dielectric block 1, and signal input and output electrodes 9 and 10 formed on the mounting face 1a so as to extend onto part of side faces 1b and 1c of the dielectric block 1.

As shown in an exploded perspective view in FIG. 2 illustrating the dielectric resonator device in FIG. 1 as cut off at a horizontal plane at its central portion for clarity, with its face 1a having main portions of the signal input and output electrodes 9 and 10 (i.e., the upper face 1a in FIG. 1) directed downwards, the inner conductors 2 and 3 are formed on the inner faces of the inner conductor forming bores 5 and 6, and thus, a tip capacitance Cs is formed between the forward end of the inner conductor 2 and the outer conductor 4, while an outer coupling capacitance Ce is produced between the portion in the vicinity of the inner conductor 2 and the signal input and output electrode 9. Such tip capacitance and outer coupling capacitance are similarly formed with respect to the inner conductor 3 also, although not particularly shown.

Figure 3:
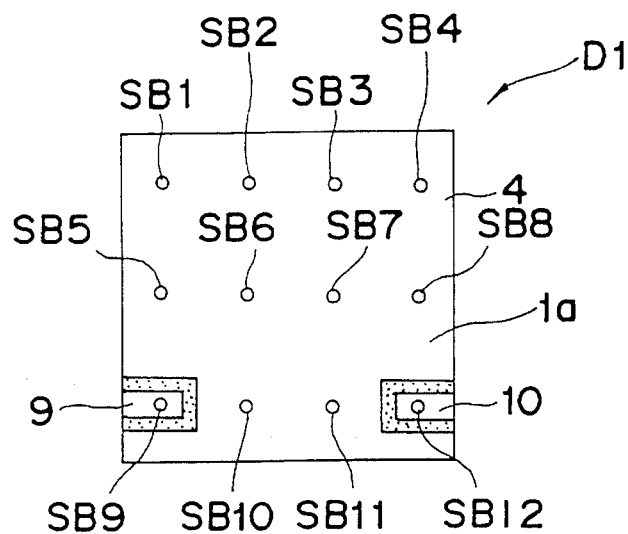
FIG. 3 is a top plan view of the dielectric resonator device of FIG. 1 as observed from the side of its mounting face.

In a top plan view in FIG. 3 in which the dielectric resonator device of FIG. 1 is observed from the side of its mounting face 1a, there are provided solder bumps SB1, SB2, SB3, SB4, SB5, SB6, SB7, SB8, SB9, SB10, SB11 and SB12. In this embodiment, the solder bumps SB1 to SB8, SB10, and SB11 are used for connecting the outer conductor 4 to ground electrodes on the mounting substrate, and the solder bumps SB9 and SB12 are used for connecting the signal input and output electrodes 9 and 10 to conductor patterns on the mounting substrate. For the formation of the solder bumps with respect to the dielectric resonator device, for example, the technique "Mixed IC Construction Of Solder Melting Connection Type" described on pages 1603 to 1629 in a separate volume of "Research Practical Application Report" vol. 26, No. 6 (1977) can be utilized.

Figure 4:
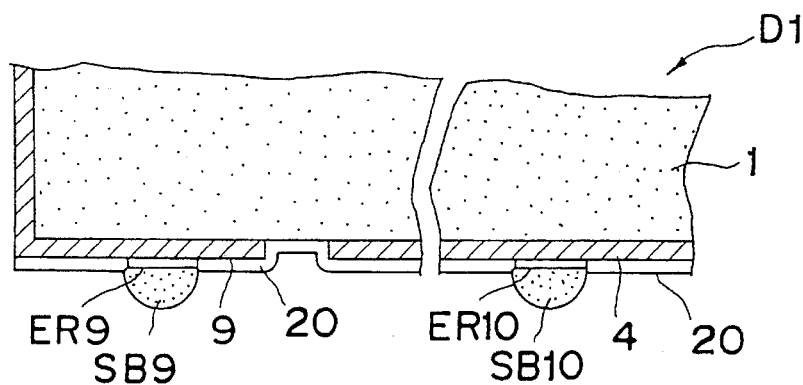
FIG. 4 is a fragmentary side sectional view showing on an enlarged scale, the construction of the dielectric resonator device of FIG. 1 at its essential portion.

Reference is also made to FIG. 4 showing a fragmentary side section on an enlarged scale for illustrating the construction at the solder bump formed portions for the dielectric resonator device described with reference to FIGS. 1 to 3. In FIG. 4, solder deposited electrodes ER9 and ER10 are each formed by forming the electrodes including three layers of Cr-Rh-Au at predetermined positions of the signal input and output electrode 9 and the outer conductor 4. In the above layer structure, the Rh layer functions as a barrier metal, and the Cr layer increases the close adhesion between Rh layer and the ground film (i.e., Ag conductor film which is for the signal input and output electrode 9 and the outer conductor 4), and further, the Au layer functions as an oxidation preventing film for Rh. The solder bumps SB9 and SB10 are formed through deposition by the dip method with respect to the solder deposited electrodes ER9 and ER10. In FIG. 4, there is also provided a solder flow preventing film 20, which is intended to form the solder bump of a predetermined shape without depositing the solder at unnecessary portions during formation of the solder bump by the dip method.

Figure 5:
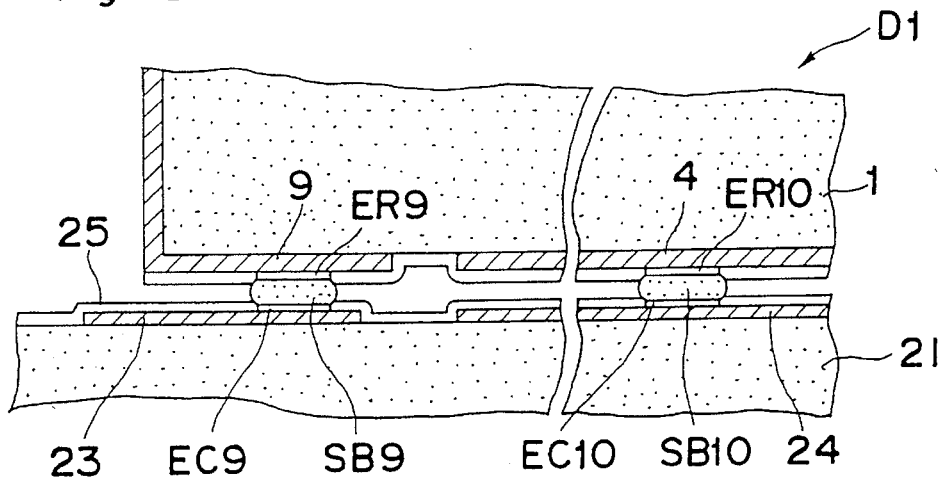
FIG. 5 is also a fragmentary side sectional view showing on an enlarged scale, the mounting arrangement of the dielectric resonator device with respect to a mounting substrate.

FIG. 5 shows a fragmentary side sectional view illustrating on an enlarged scale, a mounting arrangement of the dielectric resonator device with respect to the mounting substrate. In FIG. 5, there is shown the mounting substrate 21, on the surface of which a conductor pattern 23 for connection with one signal input and output electrode 9 of the dielectric resonator device, and another conductor pattern 24 for connection with the outer conductor 4 of the dielectric resonator device are provided. Moreover, at part of the conductor pattern 23, a solder deposition electrode EC9 is provided, while at part of the conductor pattern 24, another solder deposition electrode EC10 is provided. Furthermore, on the surface of the mounting substrate, except for such solder deposition electrodes as referred to above, a solder flow prevention film 25 is formed. With respect to the mounting substrate as described above, by placing thereon the dielectric resonator device as shown in FIG. 4 through positioning and also heating, the solder bumps SB9 and SB10 are melted for connection.

By the above arrangement, the signal input and output electrode 9 and the outer conductor 4 are respectively connected to the conductor patterns 23 and 24 on the mounting substrate. It is to be noted here that during the melting connection of the solder bumps as described above, other electronic parts may also be mounted on the mounting substrate 21 by the reflow soldering process. More specifically, by applying solder paste onto predetermined positions on the mounting substrate, and placing surface mounting electronic parts thereon, and then, passing the mounting substrate, for example, through a tunnel furnace, the dielectric resonator device can be connected by the solder bumps, and other electronic parts, by the reflow soldering.

Figure 6:
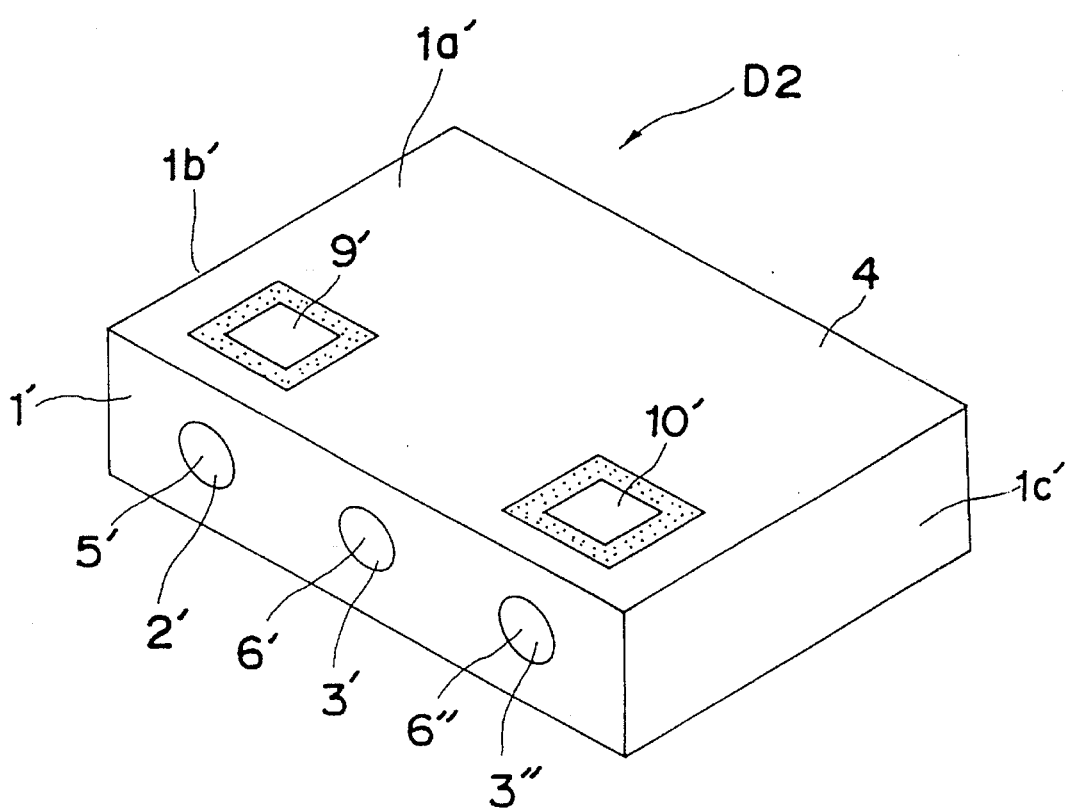
FIG. 6 is a perspective view of a dielectric resonator device according to another embodiment of the present invention.

Referring to FIG. 6, there is shown a dielectric resonator device D2 according to another embodiment of the present invention.

As compared with the dielectric resonator device D1 described earlier with reference to FIGS. 1 to 3, in the dielectric resonator device D2 in FIG. 6, the signal input and output electrodes 9' and 10' are formed only on its mounting face 1a' opposing the mounting substrate without extending onto the side faces 1b' and 1c', while three inner conductor forming bores 5', 6' and 6" are longitudinally formed through the dielectric block 1', with three inner conductors 2', 3' and 3" being formed on the inner faces of said bores 5', 6' and 6", respectively.

Even in the dielectric resonator device D2 as described above, by forming the solder bumps at predetermined positions in a manner similar to the previous embodiment, the resonator device may be readily connected onto the mounting substrate through the solder bumps.

Since other constructions and functions of the dielectric resonator device D2 and the mounting arrangement therefor are generally similar to those in the previous embodiment, a detailed description thereof is abbreviated here for brevity, with like parts being designated by like reference numerals.

It should be noted here that, in the foregoing embodiments, although the three layer electrode of Cr-Rh-Au is employed as the solder deposition electrode, the arrangement may, for example, be so modified to use Cr, Ti or Ni for the barrier metal or to use Ni or Cu as a metal with a sufficient solder wettability. Meanwhile, for the solder bumps, In-Pb solder may be employed besides Sn-Pb solder. Furthermore, the solder bumps may be formed by a method in which, after forming by soldering, a solder film having an area larger than that of the solder deposition electrode by plating, the entire device is heated to form the solder bump, or in which stand-off is preliminarily formed by Cu plating, thereby to cause the solder to adhere to the Cu.

It should also be noted that in the foregoing embodiment, although the single solder bump is described as formed at each of the signal input and output electrode portions, the arrangement may, for example, be so modified to form a plurality of solder bumps at the signal input and output electrode portions or to form solder bumps having a size different from that at the signal input and output electrode portion on the outer conductor. Meanwhile, it is also possible to arrange the plurality of solder bumps at a predetermined pattern instead of disposing them at equal intervals.

As is clear from the foregoing description, according to the present invention, the dielectric resonator device can be positively connected onto the mounting substrate both electrically and mechanically without forming the undesirable solder bridge between the signal input and output electrode. Thus, reliability of an entire apparatus on which the dielectric resonator device is mounted, may be increased.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A dielectric resonator device comprising:

a dielectric member having an outer surface;

a plurality of inner conductors provided in the dielectric member;

an outer conductor disposed on the outer surface of said dielectric member and having a mounting surface;

signal input and output electrodes disposed on the outer surface of said dielectric member to oppose a mounting substrate and electrically coupled with said inner conductors; and a plurality of solder bumps disposed on both the mounting surface of the outer conductor and on said signal input and output electrodes, said plurality of solder bumps being located so as to mechanically and electrically connect said outer conductor and said signal input and output electrodes to the mounting substrate when the solder bumps are melted.

2. A dielectric resonator device as claimed in claim 1, wherein two bores having respective inner faces are oriented in parallel to each other relative to the dielectric block so as to longitudinally extend therethrough, with the respective inner conductors being disposed on the corresponding inner faces of said two bores.

3. A dielectric resonator device as claimed in claim 1, wherein three bores having respective inner faces are oriented in parallel to each other relative to the dielectric block so as to longitudinally extend therethrough, with the inner conductors being disposed on the corresponding inner faces of said three bores.

4. A dielectric resonator device as claimed in claim 1, wherein the signal input and output electrodes are disposed only on part of the outer surface of said dielectric member.

5. A dielectric resonator device as claimed in claim 1, wherein the dielectric member has a plurality of side faces, the signal input and output electrodes are disposed on the outer surface of said dielectric member, and extend onto part of the side faces.

6. A dielectric resonator device as claimed in claim 1, further comprising a plurality of soldered deposition electrodes, each electrode including three layers of Cr-Rh-Au disposed at a predetermined position on said signal input and output electrodes and on said outer conductor, and respective solder bumps are located on corresponding said solder deposition electrodes such that the respective solder deposition electrodes are located between the corresponding solder bumps and said outer conductor.

7. A dielectric resonator device as claimed in claim 1, further comprising a respective plurality of electrodes located between the mounting surface of the outer conductor and the corresponding plurality of solder bumps.

8. A dielectric resonator device as claimed in claim 1, further comprising a solder flow preventing film disposed on the mounting surface of the outer conductor to prevent the respective solder bumps from being located at undesired positions on the outer conductor.

9. A mounting arrangement for mounting a dielectric resonator device on a mounting substrate, said mounting arrangement comprising:

a) a dielectric resonator device including:

1) a dielectric member having an outer surface;

2) a plurality of inner conductors provided in the dielectric member;

3) an outer conductor disposed on the outer surface of said dielectric member and having a mounting surface;

4) signal input and output electrodes disposed on the outer surface of said dielectric member;

5) a plurality of solder bumps located on the mounting surface of the outer conductor and on said signal input and output electrodes; and b) a mounting substrate disposed to oppose said dielectric resonator device and the mounting surface of the outer conductor, said outer conductor and said signal input and output electrodes being connected to said mounting substrate by said plurality of solder bumps through melting thereof.

10. A mounting arrangement as recited in claim 9, further comprising a first solder flow preventing film disposed on the mounting surface of the outer conductor and a second solder flow preventing film disposed on the mounting substrate for preventing the corresponding solder bumps from being located at undesired positions on the outer conductor and on the mounting substrate.

11. A method of mounting a dielectric resonator on a mounting substrate having conductive patterns thereon, the dielectric resonator including a dielectric member having a mounting surface, a plurality of inner conductors provided in the dielectric member, an outer conductor being formed on the mounting surface of the dielectric member, the outer conductor having a mounting surface, signal input and output electrodes being electrically isolated from each other and from said other conductor and formed on the mounting surface of the dielectric member and a plurality of solder bumps formed on the mounting surface of the outer conductor and on the signal input and output electrodes, the method comprising the steps of:

locating the dielectric resonator on the mounting substrate; and melting the solder bumps located on the mounting surface of the outer conductor and the signal input and output electrodes so that the solder bumps mechanically and electrically connect the conductive patterns to the signal input and output electrodes and the outer conductor.

12. The method of claim 11, wherein said step of melting the solder bumps comprises one of the steps of heating the mounting substrate and locally heating the dielectric resonator.

13. The method of claim 11, further comprising the steps of:

applying solder paste onto the mounting substrate before said step of locating the dielectric resonator on the mounting substrate;

locating a plurality of electronic components on the mounting substrate while performing the step of locating the dielectric resonator on the mounting substrate; and passing the mounting substrate through a tunnel furnace to connect the dielectric resonator to the mounting substrate through the solder bumps and to connect the electronic components to the mounting substrate through the solder paste.

14. A method of forming a dielectric resonator comprising the steps of:

providing a dielectric block;

forming a plurality of conductor bores in the dielectric block;

forming a respective inner conductor in each of the plurality of conductor bores;

forming an outer conductor on the dielectric block as to have a mounting surface;

forming a signal input electrode and a signal output electrode on the dielectric block such that said signal input electrode and said signal output electrode are electrically isolated from each other and from said outer conductor;

electrically connecting the signal input electrode and the signal output electrode to respective ones of the plurality of inner conductors; and forming a plurality of solder bumps on the mounting surface of the outer conductor and on the signal input and output electrodes so that the plurality of solder bumps mechanically and electrically connect the dielectric resonator to a mounting substrate when the plurality of solder bumps are melted.

15. The method of claim 14, further comprising the step of forming a plurality of electrodes on the outer conductor.

16. The method of claim 15, wherein the step of forming the plurality of electrodes further comprises the step of forming each electrode of three layers of Cr-Rh-Au and locating the electrodes on the outer conductor by a solder deposition process.

17. The method of claim 15, further comprising the step of depositing the respective solder bumps on the corresponding electrodes by a dip method.

18. The method of claim 14, wherein the step forming the signal input electrode and the signal output electrode further comprises the step of forming the signal input electrode and the signal output electrode to extend onto side surfaces of said dielectric block.

19. The method of claim 14, further comprising the step of forming a solder flow preventing film on the surface of the outer conductor for preventing the respective solder bumps from being located at undesired positions on the outer conductor.

* * * * *